(12) United States Patent
Williams et al.

(10) Patent No.: US 7,695,784 B2
(45) Date of Patent: Apr. 13, 2010

(54) POST POSITIONING FOR INTERDIGITAL BONDED COMPOSITE

(75) Inventors: Jay A. Williams, Torrance, CA (US); Jonathan M. Cannata, Santa Monica, CA (US); Ruibin Liu, South Pasadena, CA (US); K. Kirk Shung, Monterey Park, CA (US)

(73) Assignee: University of Southern California, Los Angeles, CA (US)

( * ) Notice: Subject to any disclaimer, the term of this patent is extended or adjusted under 35 U.S.C. 154(b) by 218 days.

(21) Appl. No.: 11/781,849

(22) Filed: Jul. 23, 2007

(65) Prior Publication Data
US 2008/0020153 A1 Jan. 24, 2008

Related U.S. Application Data

(60) Provisional application No. 60/820,038, filed on Jul. 21, 2006.

(51) Int. Cl.
*F16B 11/00* (2006.01)
*B23P 19/04* (2006.01)
*B23Q 3/00* (2006.01)

(52) U.S. Cl. ............................. 428/33; 29/238; 29/464; 216/39

(58) Field of Classification Search ........................ None
See application file for complete search history.

(56) References Cited

U.S. PATENT DOCUMENTS 3,083,444 A    4/1963  Mitchell et al.
4,412,148 A   10/1983  Klicker et al.
4,514,247 A    4/1985  Zola
4,658,176 A    4/1987  Nakaya et al.
5,239,736 A    8/1993  Sliwa, Jr. et al.
6,183,578 B1   2/2001  Ritter et al.
6,984,284 B2   1/2006  Yin et al.
2007/0178714 A1 8/2007  Gu et al.
2008/0165468 A1 7/2008  Berolini et al.

OTHER PUBLICATIONS

Cannata, J. et al. Development of a 35-MHz Piezo-Composite Ultrasound Array for Medical Imaging. IEEE Transactions on Ultrasonics, Ferroelectrics, and Frequency Control, vol. 53, No. 1, Jan. 2006, pp. 224-236.

(Continued)

*Primary Examiner*—Allan Olsen
(74) *Attorney, Agent, or Firm*—McDermott Will & Emery LLP (57) ABSTRACT

Methods and systems are described for making posts and kerfs in an interdigital bonded composite. The desired alignment criteria for a plurality of posts and kerfs in a pair of slabs are determined, as well as the desired widths W of the posts and the desired widths K of the kerfs. The posts in the first slab are configured to be received into corresponding kerfs in the second slab, and vice versa, so that the pair of slabs can be interdigitated to generate a composite. At least one of an alignment post and an alignment kerf are created, in at least one of the slabs. The alignment posts and the alignment kerf are configured to allow the plurality of posts and kerfs to be correctly positioned and aligned, in accordance with the desired alignment criteria.

13 Claims, 4 Drawing Sheets

OTHER PUBLICATIONS

Yin, J. et al. Ultra-Fine Piezoelectric Composites for High Frequency Ultrasonic Transducers. IEEE International Ultrasonics, Ferroelectrics, and Frequency Control Joint 50th Anniversary Conference (0-7803-8412-1/04), 2004, pp. 1962-1965.

Ritter, T.A. et al. A 30-MHz Piezo-Composite Ultrasound Array for Medical Imaging Applications. IEEE Transactions on Ultrasonics, Ferroelectrics, and Frequency Control, vol. 49, No. 2, Feb. 2002, pp. 217-230.

Liu, R. et al. Interdigital Pair Bonding for High Frequency (20-50 MHz) Ultrasonic Composite Transducers. IEEE Transactions on Ultrasonics, Ferroelectrics, and Frequency Control, vol. 48, No. 1, Jan. 2001, pp. 299-306.

International Search Report for PCT Application Serial No. PCT/US07/74140, mailed on Aug. 27, 2008.

FIG. 4C ic # POST POSITIONING FOR INTERDIGITAL BONDED COMPOSITE

CROSS-REFERENCE TO RELATED APPLICATIONS

This application is based upon, and claims the benefit of priority under 35 U.S.C. § 119(e) from U.S. Provisional Patent Application Ser. No. 60/820,038, filed on Jul. 21, 2006, entitled "Interdigital Bonded Composite Post Positioning Technique". The content of this provisional application is incorporated herein by reference in its entirety as though fully set forth.

STATEMENT REGARDING FEDERALLY SPONSORED RESEARCH

This invention was made with government support under Contract No. P41-EB2182 awarded by the National Institutes of Health. The government has certain rights in the invention.

BACKGROUND

A wide range of techniques have been developed for fabricating composites. Some of the techniques may have inherently good positioning of the posts as a result of the manufacturing process but may not be capable of producing a finer scale composite or one with adequate consistency.

Fabrication technology for fine scale composites tends to be challenging, particularly for high frequency applications. One of the techniques for fine scale composites is referred to as the interdigital bonded composite method.

A common fault in the interdigital bonded composite method may be an inability to reliably achieve consistently positioned and aligned posts. This may result in composites being produced that may not perform as expected.

SUMMARY

Methods and systems are described for making posts and kerfs in an interdigital bonded composite. The desired alignment criteria for a plurality of posts and kerfs in a pair of slabs are determined, as well as the desired widths W of the posts and the desired widths K of the kerfs. The posts in the first slab are configured to be received into corresponding kerfs in the second slab, and vice versa, so that the pair of slabs can be interdigitated to generate a composite. At least one of an alignment post and an alignment kerf are created in at least one of the slabs. The alignment post and the alignment kerf are configured to allow the plurality of posts and kerfs to be correctly positioned and aligned, in accordance with the desired alignment criteria.

DETAILED DESCRIPTION

Composites are materials made from two or more different constituent materials. In an interdigital pair bonding process for creating a composite, two pieces of material are provided that have kerfs and posts produced. The two pieces of material are then interdigitated and bonded together to create a fine scale composite. Typically, interdigital bonded composite processes first produce material that has kerfs large enough to accept the posts created by the process, plus room for desired final composite gaps on both sides of the posts. Once the material pieces are fabricated, one of them is turned over, interdigitated with the other and bonded in order to form the fine scale composite. Reliably achieving consistently positioned and aligned posts is very challenging.

In the present disclosure, systems and methods are described that significantly reduce post position errors and misalignment in interdigital bonded composites, thereby producing more uniform composites that have far greater consistency and adherence to design parameters and performance requirements.

In the description that follows, a number of technical terms, including but not limited to kerf, post, pitch, and offset, are used. Also used are a number of mathematical terms or shorthand symbols. A glossary is provided as an Appendix to the present disclosure. In the present patent, all the technical and mathematical terms listed in the glossary will have the meaning set forth in the glossary.

Four exemplary embodiments of post positioning techniques are described below. In all four embodiments, alignment criteria for the posts and kerfs are determined at the outset. These alignment criteria may include, but are not limited to: offset values of the posts and kerfs; desired final gap widths of the assembled composite; and a tolerance value T.

Figure 1A:
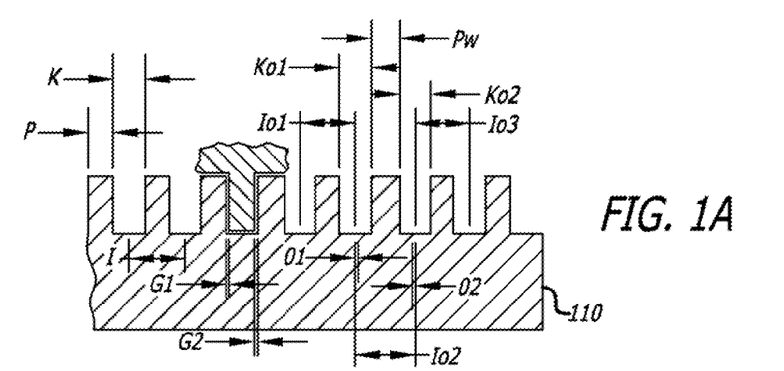
FIGS. 1A, 1B, and 1C illustrate a first post positioning technique for an interdigital bonded composite.
Figure 1B:
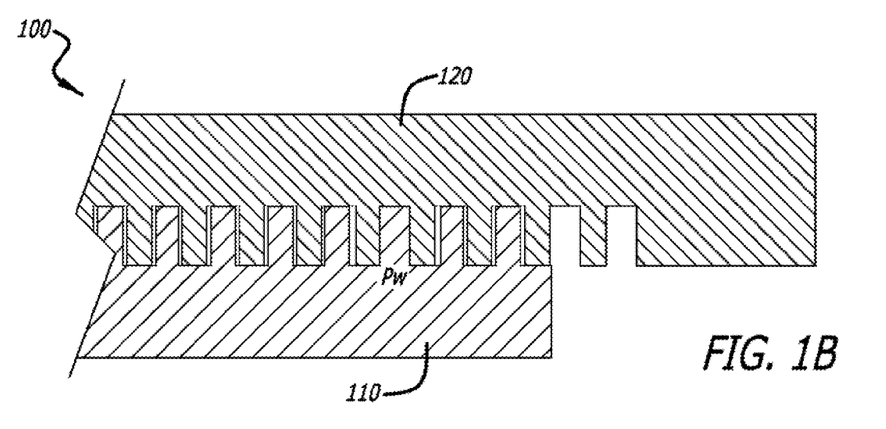
Figure 1C:
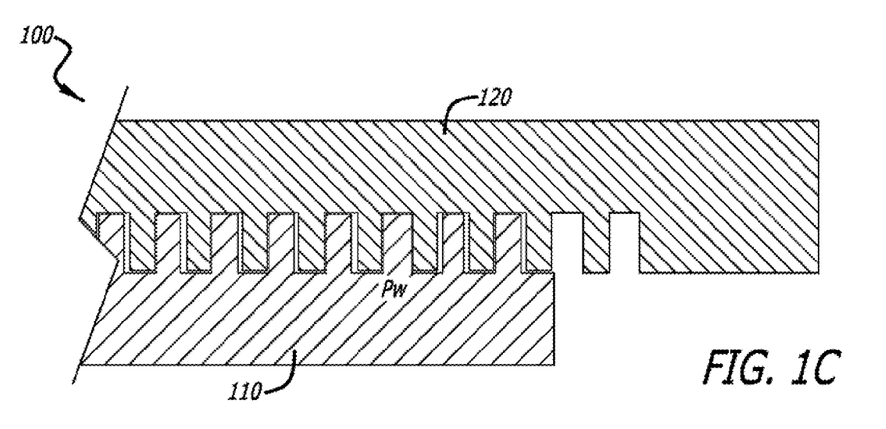

FIGS. 1A, 1B, and 1C illustrate a first post positioning technique for an interdigital bonded composite 100, created by interdigitating a first slab 110 with a second slab 120. In overview, the first post positioning technique involves creating two kerfs that are offset away from each other to produce one larger alignment post between. More particularly, in the first post positioning technique, two adjacent kerfs are offset away from each other to form one post almost as wide as a regular kerf, to position the other posts in the desired location in their respective kerfs. The posts on either side are narrower than typical and may break.

In the first post positioning technique, the following procedure is undertaken.

1. Determine the dimensions of, and post alignment criteria for, the composite pattern as required. Determine if more than one alignment post per piece is required. The positioning details of the kerfs and posts are shown in FIG. 1A.

2. Make at least one set of offset kerfs ($K_{o1}$ and $K_{o2}$) for the alignment post(s) ($P_w$) near the edge to ensure engagement. The post(s) on either side of the alignment post ($P_w$) may be narrower than normal. The offset values ($O_1$ and $O_2$) depend on the gap widths ($G_1$ and $G_2$) (which depend on kerf width (K), post width (P), and desired post position), single tolerance value (T), and ease of fit.

For centering the posts (P), the gaps ($G_1$ and $G_2$) are equal and the offsets ($O_1$ and $O_2$) are equal. For off center posts (P), the gaps ($G_1$ and $G_2$) and their associated offsets ($O_2$ and $O_1$ respectively) differ by the same amount:

$$G_1 - G_2 = O_2 - O_1 \text{ or } G_2 - G_1 = O_1 - O_2.$$

Each mating piece may have to have its alignment post(s) ($P_w$) shifted in the opposite direction from the other for them to line up and engage properly when it is turned over for bonding, otherwise they may interfere with each other and not allow the posts to interdigitate properly.

The offsets (O1 and O2) are a single tolerance (T) narrower than the desired gap width(s) (G1 and G2). O1=G2−T, and O2=G1−T, in this process, as offset 1 (O1) gets larger, gap 2 (G2) gets larger.

The alignment post (Pw) width is equal to a typical post (P) plus the offsets (O1+O2) and thus narrower than a typical kerf (K) by only double the single tolerance, value (2T) resulting in a maximum positioning error of a single tolerance value (T) from the desired position.

Pw=P+O1+O2, and since K=P+G1+G2, and each Offset=Gap−T, it follows that Pw=K−2T.

Each offset kerf (Ko1 and Ko2) is indexed in (IO1 and IO3 respectively) from its respective side by a typical index (I) minus its associated offset (O1 or O2 respectively): IO1=I−O1; and IO3=I−O2.

The center index (IO2) is a typical index (I) plus the total of the two offsets (O1+O2) which creates the alignment post (Pw):

$$IO2 = I + O1 + O2 \text{ and since } I = P + K \text{ then } IO2 = K = P + O1 + O2 = Pw.$$

The above procedure ensures that while creating an alignment post (Pw), the total of the three offset indexes (IO1+IO2+IO3) equals three typical indexes (3I) to maintain proper index alignment and interdigitation beyond that area.

IO1+IO2+IO3=3I; as the offsets cancel, (I−O1)+(I+O1+O2)+(I−O2)=3I.

The correct offset indexes are now inserted into the fabrication process.

FIG. 1B illustrates posts that are assembled in accordance with the first post positioning technique, and that are centered with equal gap widths. FIG. 1C illustrates posts that are assembled in accordance with the first post positioning technique, and that are off-center, with alternating gap widths.

Figure 2A:
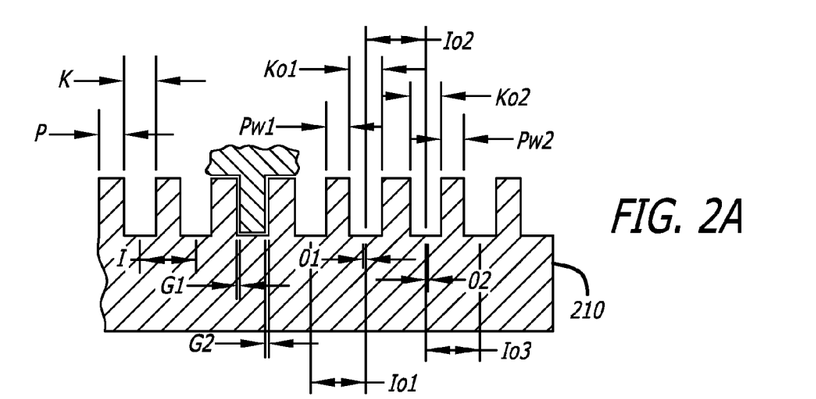
FIGS. 2A, 2B, and 2C illustrate a second post positioning technique for an interdigital bonded composite.
Figure 2B:
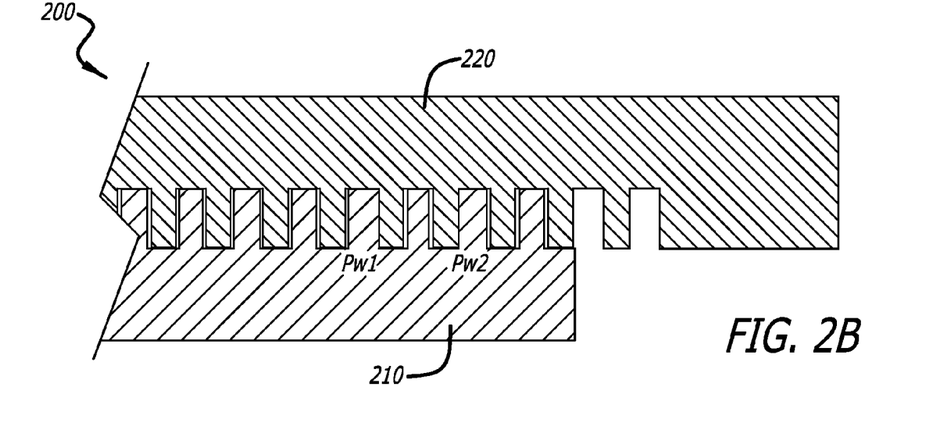
Figure 2C:
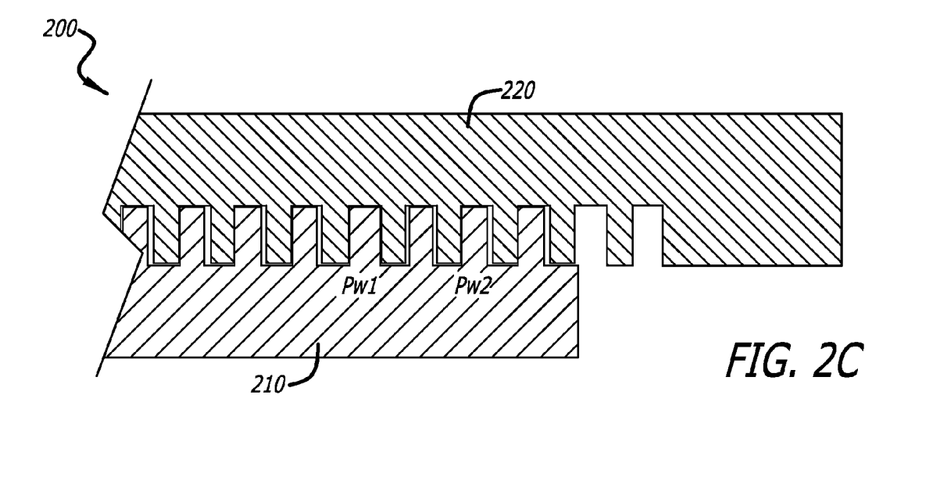

FIGS. 2A, 2B, and 2C illustrate a second post positioning technique for an interdigital bonded composite 200, created by interdigitating a first slab 210 with a second slab 220. In overview, the second post positioning technique involves creating two kerfs that are offset toward each other to produce two opposing alignment posts. More particularly, in the post positioning technique illustrated in FIGS. 2A-2C, two adjacent kerfs are offset toward each other, near the edge of the part, to form two posts slightly wider in opposite directions to position the other posts in the desired location in their respective kerfs. The post in between is much narrower than typical and may break.

In the second post positioning technique, the following procedure is undertaken.

1. Determine the dimensions of the composite pattern as required. Determine if more than one set of alignment posts per piece are required.

2. Make at least one set of offset kerfs (Ko1 and Ko2) for the alignment posts (Pw1 and Pw2) near the edge to ensure engagement. The post in between the alignment posts (Pw1 and Pw2) may be narrower than normal. The offset values (O1 and O2) depend on the gap widths (G1 and G2, which in turn depend on kerf width (K), post width (P), and desired post position), single tolerance value (T), and ease of fit.

For centering the posts (P), the gaps (G1 and G2) are equal and the offsets (O1 and O2) are equal. For off center posts (P), the gaps (G1 and G2) and their associated offsets (O1 and O2 respectively) differ by the same amount:

$$G1 - G2 = O1 - O2, \text{ or } G2 - G1 = O2 - O1.$$

Each mating piece may have to have its alignment post(s) (Pw) shifted in the opposite direction from the other for them to line up and engage properly when it is turned over for bonding, otherwise they may interfere with each other and not allow the posts to interdigitate properly.

The offsets (O1 and O2) are a single tolerance (T) narrower than the desired gap width(s) (G1 and G2). O1=G1−T and O2=G2−T in this process, as offset 1 gets larger, gap 1 gets larger.

The alignment posts (Pw1 and Pw2) widths are equal to a typical post (P) plus their associated offsets (O1 and O2 respectively). Since they are offset toward each other, the space between them is reduced by the offsets (O1 and O2 respectively) thereby creating two alignment posts that reduce the available space for the posts between them by the total of both offsets (O1+O2). This makes the space wider by only double a single tolerance value (2T) resulting in a maximum positioning error of a single tolerance value (T) from the desired position.

Pw1=P+O1 toward Pw2 and Pw2=P+O2 toward Pw1.

Each offset kerf (Ko1 and Ko2) is indexed in (IO1 and IO3 respectively) from its respective side by a typical index (I) plus its associated offset (O1 or O2 respectively:

$$IO1 = I + O1; IO3 = I + O2.$$

The center index (IO2) is a typical index (I) minus the total of the two offsets (O1 and O2) which creates the alignment posts (Pw1 and Pw2 respectively):

$$IO2 = I - (O1 + O2).$$

The above procedure ensures that while creating an alignment post (Pw), the total of the three offset indexes (IO1+IO2+IO3) equals three typical indexes (3I) to maintain proper index alignment and interdigitation beyond that area.

IO1+IO2+IO3=3I; as the offsets cancel, (I+O1)+(I−(O1+O2))+(I+O2)=3I

The appropriate offset indexes can now be inserted into the fabrication process.

FIG. 2B illustrates posts that are assembled in accordance with the second post positioning technique, and that are centered with equal gap widths. FIG. 2C illustrates posts that are assembled in accordance with the second post positioning technique, and that are off-center, with alternating gap widths.

Figure 3A:
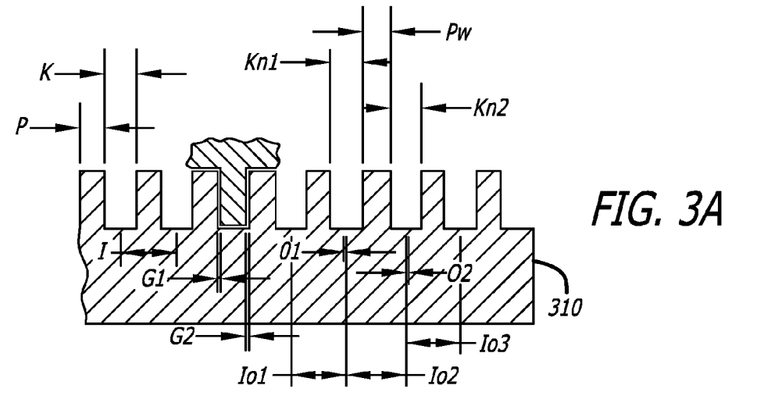
FIGS. 3A, 3B, and 3C illustrate a third post positioning technique for an interdigital bonded composite.
Figure 3B:
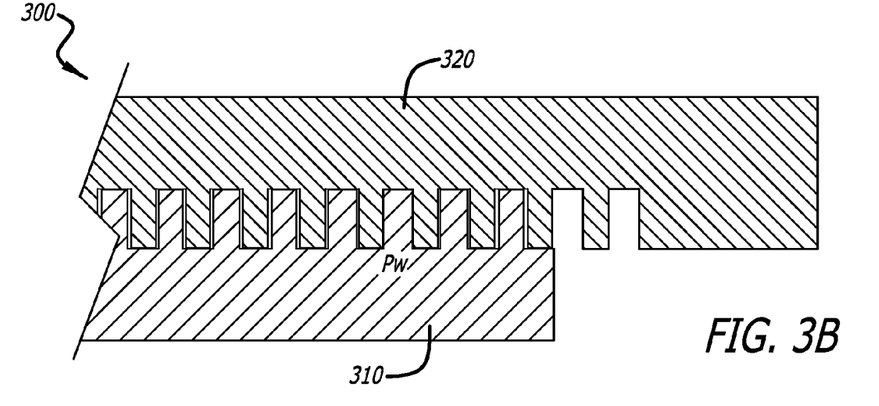
Figure 3C:
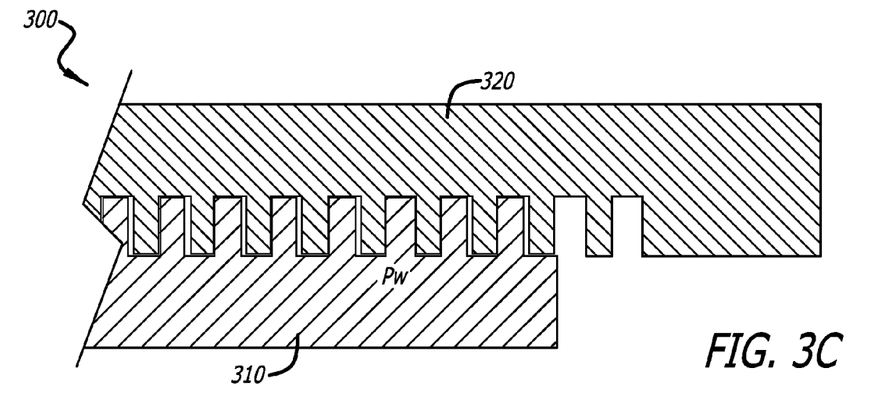

FIGS. 3A, 3B, and 3C illustrate a third post positioning technique for an interdigital bonded composite 300, created by interdigitating a first slab 310 with a second slab 320. In overview, this post positioning technique involves creating two kerfs which may be narrower offset farther apart to produce one larger alignment post. More particularly, in the third post positioning technique, two adjacent alignment kerfs are created near the edge of the part, either of which may be narrower than typical. These alignment kerfs may be offset slightly from normal position to form one post almost as wide as a regular kerf, so as to position the other posts in the desired location in their respective kerfs. The posts on either side are normal width.

In the third post positioning technique, the following procedure may be undertaken.

1. Determine the dimensions of the composite pattern as required. Determine if more than one alignment post per piece is required.

2. Make at least one set of kerfs (Kn1 and Kn2), either may be offset and/or narrower than typical, for the alignment post(s) (Pw) near the edge to ensure engagement. The post(s) on either side of the alignment post (Pw) are typical. The offset values (O1 and O2) and narrower kerfs (Kn1 and Kn2) depend on the gap widths (G1 and G2) (which depend on kerf width (K), post width (P), and desired post position), single tolerance value (T), and ease of fit.

For centering the posts (P), the gaps (G1 and G2) are equal, the offsets (O1 and O2) are equal, and the narrow kerfs (Kn1 and Kn2) are equal. For off center posts (P), the gaps (G1 and G2) and their associated offsets (O2 and O1 respectively) differ from each other.

It is determined how far off center the post(s) needs to be for the gaps required:

$G1=((K-P)/2)-$(off center value) and $G2=((K-P)/2)+$(off center value);

or $G1=((K-P)/2)+$(off center value) and $G2=((K-P)/2)-$(off center value).

Each mating piece may have to have its alignment post(s) (Pw) shifted in the opposite direction from the other for them to line up and engage properly when it is turned over for bonding, otherwise they may interfere with each other and not allow the posts to interdigitate properly.

The kerfs (Kn1 and Kn2) for creating the alignment post(s) (Pw) are determined by subtracting the gap width (G2 or G1 respectively), minus a single tolerance (T) each, from a typical kerf width K.

$Kn1=K-(G2-T)$ and $Kn2=K-(G1-T)$;

and the resulting offsets $O1=(K-Kn1)/2$ and $O2=(K-Kn2)/2$;

hence $O1=(G2-T)/2$ and $O2=(G1-T)/2$.

The alignment post (Pw) width is equal to a typical post (P) plus double the total of the offset values $(2(O1+O2))$ and thus narrower than a typical kerf (K) by double the single tolerance value (2T) resulting in a maximum positioning error of a single tolerance value (T) from the desired position.

$Pw=P+2(O1+O2)$ and since $K=P+G1+G2$;

and each Offset=(Gap−T)/2, then $Pw=K-2T$.

Each kerf (Kn1 and Kn2) used to create the alignment posts (Pw) may be indexed in (IO1 and IO3 respectively) from its respective side by a typical index (I) minus its associated offset (O1 or O2 respectively):

$IO1=I-O1; IO3=I-O2$.

The center index (IO2) is a typical index (I) plus the total of the two offsets (O1+O2) which, along with the associated kerfs (Kn1 and Kn2), creates the alignment post(s) (Pw).

$IO2=I+O1+O2$; and since $I=P+K$, then $IO2=((Kn1+Kn2)/2)=P+2(O1+O2)=Pw$.

All of the above ensures that while creating an alignment post (Pw), the total of the three offset indexes (IO1+IO2+IO3) equals three typical indexes (3I) to maintain proper index alignment and interdigitation beyond that area.

$IO1+IO2+IO3=3I$ as the offsets cancel $(I-O1)+(I+O1+O2)+(I-O2)=3I$.

The appropriate offset indexes and kerf widths are now inserted into the fabrication process.

FIG. 3B illustrates posts that are assembled in accordance with the second post positioning technique, and that are centered with equal gap widths. FIG. 3C illustrates posts that are assembled in accordance with the second post positioning technique, and that are off-center, with alternating gap widths.

Figure 4A:
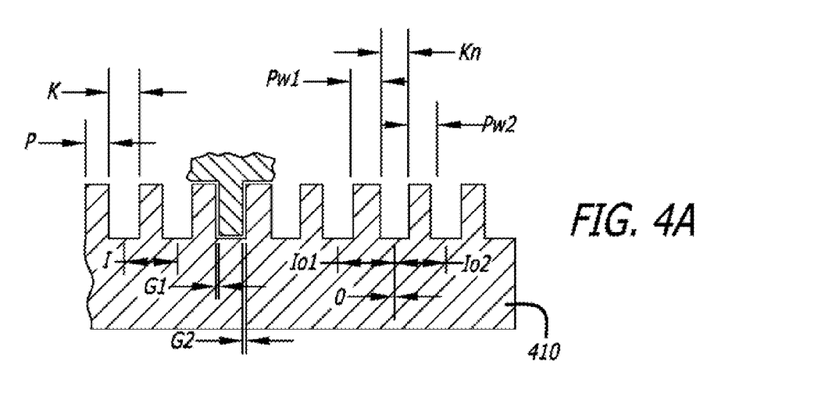
FIGS. 4A, 4B, and 4C illustrate a fourth post positioning technique for an interdigital bonded composite.
Figure 4B:
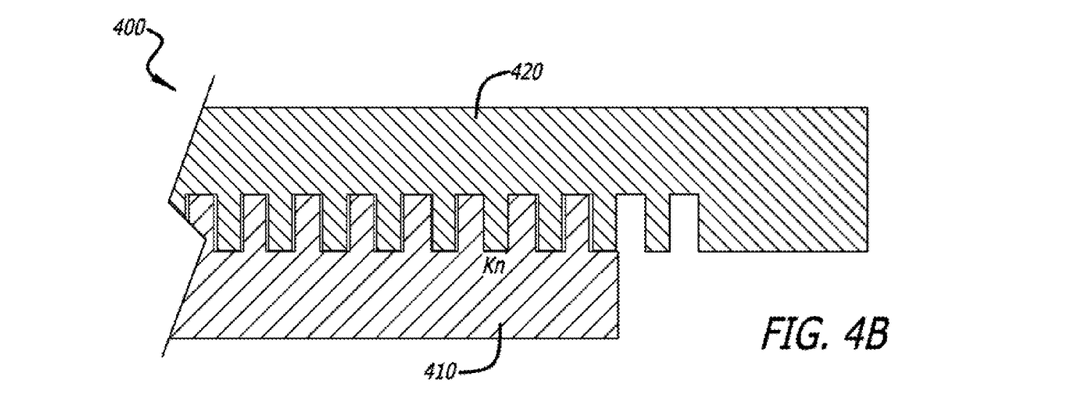
Figure 4C:
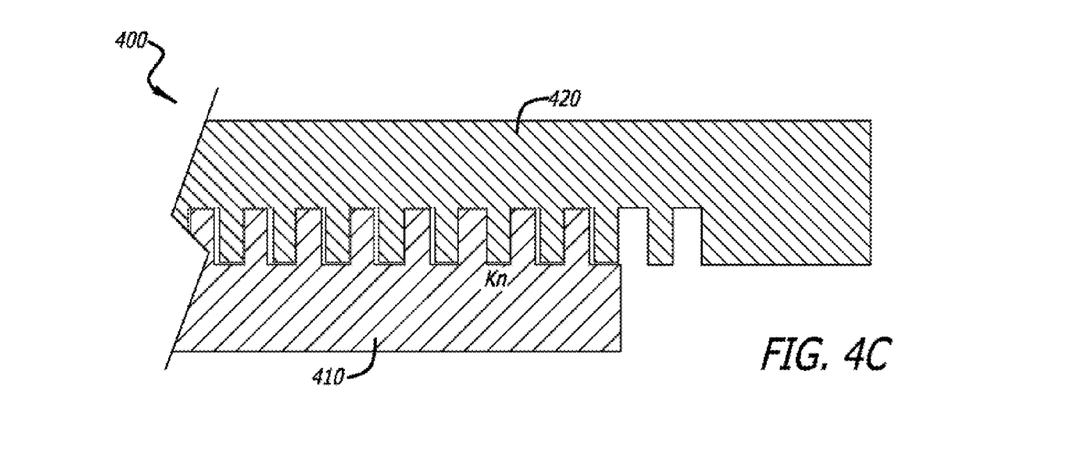

FIGS. 4A, 4B, and 4C illustrate a fourth post positioning technique for an interdigital bonded composite 400, created by interdigitating a first slab 410 with a second slab 420. In overview, this technique involves creating narrower kerf to produce two alignment posts with one alignment kerf in between. More particularly, the fourth post positioning technique involves creating, near the edge of the part, a kerf almost as narrow as a typical post, to form an alignment kerf to position the other posts in the desired location in their respective kerfs, the posts on either side may be wider than normal.

In the embodiment illustrated in FIGS. 4A-4C, the following procedure may be undertaken.

1. Determine the dimensions of the composite pattern as required. Determine if more than one alignment post per piece is required. The positioning details are illustrated in FIGS. 4A.

2. Make at least one narrow alignment kerf (Kn) near the edge to ensure engagement. The post(s) (Pw1 and Pw2) on either side of the alignment kerf (Kn) may be wider than normal. The offset value (O) for off center posts depends on the gap widths (G1 and G2) (which depend on kerf width (K), post width (P), and desired post position), single tolerance value (T), and ease of fit. The narrow alignment kerf width (Kn) is always equal to a typical post width (P) plus double the single tolerance value (2T).

$Kn=P+2T$, or $Kn=K-((G1+G2)-2T)$ since $K=P+G1+G2$.

For centering the posts (P), the gaps (G1 and G2) are equal and the offset (O) is zero:

$K-P)/2=$Gaps; $O=$zero; $IO1=IO2=I$

For off center posts (P), the gaps (G1 and G2) each change by the offset (O) value.

$G1=((K-P)/2)+O$ and $G2=((K-P)/2)-O$, or $G1=((K-P)/2)-O$ and $G2=((K-P)/2)+O$;

hence $(G1-G2)/2=O$ or $(G2-G1)/2=O$.

Each mating piece may have to have its alignment kerf(s) (Kn) shifted in the opposite direction from the other for them to line up and engage properly when it is turned over for bonding, otherwise they may interfere with each other and not allow the posts to interdigitate properly.

The narrow alignment kerf (Kn) may be indexed in (IO1) by a typical index (I) plus or minus the associated offset (O) and indexed in (IO2) from the other side by the inverse.

$IO1=I+O$, and $IO2=I-O$ or $IO1=I-O$, and $IO2=I+O$.

The above procedure ensures that while creating an alignment kerf (Kn) the total of the two offset indexes (IO1+IO2) equals two typical indexes (2I) to maintain proper index alignment and interdigitation beyond that area.

$IO1+IO2=2I$ as the offsets cancel $(I-O)+(I+O)=2I$

The appropriate offset indexes and kerf widths may be inserted into the fabrication process.

FIG. 4B illustrates posts that are assembled in accordance with the second post positioning technique, and that are centered with equal gap widths. FIG. 4C illustrates posts that are assembled in accordance with the second post positioning technique, and that are off-center, with alternating gap widths.

In all of the embodiments described above, the amount the offset kerfs are shifted from the normal position may have to accommodate the maximum tolerance allowable for positioning. The tolerance cannot be zero or the parts will not fit together without possible damage. The exact value of an offset may depend on the desired gap width (which depends on kerf width, post width, and desired post position), tolerances, and ease of fit. To position the posts off center, the offset kerfs may have to be shifted in opposite directions on each of the two pieces, in order for them to line up and engage with each other when the one piece is flipped over for bonding, otherwise they may interfere with each other and may not allow the posts to interdigitate properly.

An apparatus that produces a composite, in accordance with any one of the four post positioning techniques described above, may be a device operable to create a plurality of posts and kerfs in a pair of slabs, the plurality of posts and kerfs having desired alignment criteria and desired widths. The posts in a first slab in the pair of slabs are configured to be received into corresponding kerfs in a second slab in the pair of slabs and vice versa, so that the pair of slabs can be interdigitated to assemble a composite. The device may be operable to create at least one of an alignment post and an alignment kerf, in at least one of the slabs, where the alignment post and/or the alignment kerf are configured to allow the plurality of posts and kerfs to be correctly aligned and positioned in accordance with the desired alignment criteria and widths. The device may be operable to create the alignment post and/or the alignment kerf near an edge of the slab.

The device may be any of the commercially available devices for making posts and kerfs, including but not limited to a dicing saw, a milling machine, a laser, a mold press, an RIE (Reactive Ion Etcher), a chemical etcher, and an EDM (an electron discharge mill).

The first slab may be made of a first material, and the second slab may be made of a second material. The second material may or may not be different from the first material. The second slab may or may not be separated from the first slab.

The device may be a manually operated device, or a computer-controlled device. Computer-controlled devices may be controlled by a processing system configured to implement the methods, systems, and algorithms described in the present disclosure, using computer software. A computer-usable medium may have stored therein computer-usable instructions for a processing system, wherein said instructions when executed by the processing system may cause the processing system to: determine desired alignment criteria for a plurality of posts and kerfs in a pair of slabs, as well as desired widths W of the posts and desired widths K of the kerfs; and generate dimensions, relative positions, and alignment criteria for at least one of an alignment post and an alignment kerf, in at least one of the slabs, the alignment post and/or the alignment kerf being configured to allow the plurality of posts and kerfs to be correctly aligned and positioned in accordance with the desired alignment criteria, as described in detail above. The alignment post and/or the alignment kerf may be positioned near an edge of the slab. The computer-readable medium may include, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

In sum, methods and systems have been described that allow post position errors and misalignment to be greatly reduced, thereby producing a more uniform composite that has far greater consistency and adherence to design parameters and performance requirements. This methods and systems described in the present disclosure produce alignment posts and/or kerfs that cause the remainder of the posts to be positioned, as specified, in their respective kerfs within a reasonable margin of error. This will then allow very fine scale composites to be produced with greater accuracy by having the ability to consistently position the posts, in any position desired, within their respective kerfs.

While certain embodiments have been described of systems and methods for making posts and kerfs in an interdigital bonded composite, it is to be understood that the concepts implicit in these embodiments may be used in other embodiments as well. The protection of this application is limited solely to the claims that now follow.

In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

APPENDIX—GLOSSARY

Technical Terms:
Alignment Kerf or Positioning Kerf—kerf(s) to aid in positioning the desired post(s) within the desired kerf(s)
Alignment Post or Positioning Post—post(s) to aid in positioning the desired post(s) within the desired kerf(s)
Gap—distance(s) between posts in an assembled composite
Index—distance between centers of the desired posts or kerfs in material
Interdigital Bonded Composite—any composite made from interdigitating pieces of material having posts and kerfs
Interdigitate—when posts of one or more materials are positioned in the kerfs between the posts of one or more others
Kerf—slot, trench, channel, trough, or groove of desired size in material
Material—any substance, or a composite that is completed, partially completed, or needing further processing
Offset—difference between the desired index and the index used to create the alignment post(s) or kerf(s)
Pitch—distance between centers of desired posts, kerfs or gaps in a finished or partially finished composite
Post—material of desired size with kerf(s) on either side (may contain post(s) and gap(s) from prior processing)

Mathematical Terms:
D—difference in width of the varying gaps between off center posts in an assembled composite
G, G1 and G2 gaps between posts in an assembled composite or desired final gap width(s) of a completed composite
I—desired index of the material posts or kerfs prior to bonding
IO1, IO2, and IO3 index of the offset kerfs for creating the alignment post(s) or kerf(s)
K—desired kerf width in material prior to bonding
Kn, Kn1, and Kn2 kerf(s) that may be narrower than width 'K' for creating the alignment post(s) or kerf(s)
Ko1 and Ko2 offset kerfs of width 'K' used for creating alignment post(s) that may be wider than posts of width 'P'
O, O1, and O2—offset(s), difference from index 'I', for the kerf(s) used to create the alignment post(s) or kerf(s)
P—desired post width of material prior to bonding (may contain post(s) and gap(s) from prior processing)
Pf—desired final post width of the completed composite
Pw, Pw1, and Pw2 post(s) that may be wider than width 'P' for use as the alignment post(s)

T—single tolerance, half the total tolerable post misalignment from one extreme position to the other.

What is claimed is:

1. A method of making posts and kerfs in an interdigital bonded composite, the method comprising:
   determining desired spacing criteria for a plurality of posts and kerfs in a pair of slabs, as well as desired widths W of the posts and desired widths K of the kerfs which are larger than the widths W of the posts; wherein the posts in a first slab in the pair are configured to be received into corresponding kerfs in a second slab in the pair and vice versa, so that the pair of slabs can be interdigitated to assemble a composite in which there is at least one gap between each post in its corresponding kerf of a desired width; and
   creating at least one of an alignment post and an alignment kerf, in at least one of the slabs which is configured to cause the size of the at least one gap between each post in its corresponding kerf when the posts in the first slab are received into the corresponding kerfs in the second slab to be substantially the desired width;
   wherein the alignment post and the alignment kerf are configured to allow the plurality of posts and kerfs to be correctly aligned and positioned, in accordance with the desired alignment criteria and the desired widths.

2. The method of claim 1, wherein the act of creating the alignment post and the alignment kerf comprises:
   making at least one pair of adjacent alignment kerfs $Kn1$ and $Kn2$ that are offset toward each other by offset values $O1$ and $O2$ respectively, either $Kn1$ and $Kn2$ being narrower than K, so as to create between $Kn1$ and $Kn2$ an alignment post $P_w$ that has a width greater than the desired width W of the plurality of posts, and so as to make the posts on each side of the alignment post Pw have a width W;
   constructing a width of the alignment kerf $Kn1$ to be equal to the desired width K of the plurality of kerfs minus twice the offset value $O1$, and constructing a width of the alignment kerf $Kn1$ to be equal to the desired width K of the plurality of kerfs minus twice the offset value $O2$; and
   constructing a width of the alignment post $P_W$ to be equal to the desired width W of the remaining posts plus twice the sum of the offset values $O1$ and $O2$.

3. The method of claim 1, wherein the act of creating the alignment post and the alignment kerf comprises:
   making at least one alignment kerf Kn that is narrower than K, so as to create on each side of the alignment kerf Kn two alignment posts $P_{W1}$ and $P_{W2}$ that are wider than W; and
   constructing the width of the alignment kerf Kn to be equal to the desired width W of the plurality of posts, plus two times a single tolerance value T.

4. The method of claim 1, wherein the alignment criteria comprise at least one of:
   offset values of the posts and kerfs;
   desired final gap widths of the assembled composite; and
   a tolerance value T.

5. The method of claim 1, wherein the at least one of an alignment post and an alignment kerf comprises one of:
   a plurality of alignment posts; and
   a plurality of alignment kerfs.

6. The method of claim 1, wherein the act of creating the alignment post and the alignment kerf comprises creating the alignment post and the alignment kerf near an edge of the at least one slab.

7. The method of claim 1, wherein the act of creating the alignment post and the alignment kerf comprises:
   making at least one pair of kerfs $KO1$ and $KO2$ that are offset away from each other by offset values $O1$ and $O2$ respectively, so as to create between kerf $KO1$ and kerf $KO2$ an alignment post $P_W$ that has a width greater than the desired width W of the plurality of posts, and so as to make the posts of each side of the alignment post $P_W$ substantially narrower than W; and
   constructing a width of the alignment post $P_w$ to be equal to the desired width W of the plurality of posts plus the offset values $O1$ and $O2$.

8. The method of claim 7, wherein the offset values $O1$ and $O2$ are set to be a single tolerance T narrower than desired gap widths $G1$ and $G2$ that are defined between adjacent ones of the plurality of posts in the assembled composite.

9. The method of claim 1, wherein the act of creating the alignment post and the alignment kerf comprises:
   making at least one pair of adjacent kerfs $KO1$ and $KO2$ that are offset toward each other by offset values $O1$ and $O2$ respectively, so as to create at least two opposing alignment posts $Pw1$ and $Pw2$ that are slightly wider in opposite directions, with the kerfs $KO1$ and $KO2$ and a post substantially narrower than W disposed in between $Pw1$ and $Pw2$; and
   constructing a width of the alignment post $Pw1$ to be equal to the desired width W of the remaining posts plus the offset value $O1$, and constructing a width of the alignment post $Pw2$ to be equal to the desired width W of the plurality of posts plus the offset value $O2$.

10. The method of claim 9, wherein the offset values $O1$ and $O2$ are set to be a single tolerance T narrower than desired gap widths $G1$ and $G2$ that are defined between adjacent ones of the plurality of posts in the assembled composite.

11. A method of making an interdigital bonded composite, the method comprising:
   determining desired alignment criteria for a plurality of posts and kerfs in a pair of slabs, wherein the posts in a first slab in the pair are configured to be received into corresponding kerfs of a second slab in the pair, and vice versa;
   creating at least one of an alignment post and an alignment kerf, in at least one of the slabs, wherein the alignment post and the alignment kerf are configured to allow remaining ones of the plurality of posts and kerfs to be correctly aligned and positioned;
   creating the plurality of posts and kerfs in the pair of slabs, in accordance with the desired alignment criteria;
   interdigitating the pair of slabs;
   joining the two interdigitated slabs to assemble a composite; and
   removing the alignment post.

12. A method of making an interdigital bonded composite, the method comprising:
   determining desired alignment criteria for a plurality of posts and kerfs in a pair of slabs, wherein the posts in a first slab in the pair are configured to be received into corresponding kerfs of a second slab in the pair, and vice versa;
   creating at least one of an alignment post and an alignment kerf, in at least one of the slabs, wherein the alignment post and the alignment kerf are configured to allow remaining ones of the plurality of posts and kerfs to be correctly aligned and positioned;
   creating the plurality of posts and kerfs in the pair of slabs, in accordance with the desired alignment criteria;
   interdigitating the pair of slabs; and joining the two interdigitated slabs to assemble a composite, wherein the act of creating at least one of an alignment post and an alignment kerf comprises one of:

making at least one pair of kerfs KO1 and KO2 that are offset away from each other by offset values O1 and O2 respectively, so as to create in between KO1 and KO2 an alignment post Pw that has a width that is greater than the desired width W of the plurality of posts;

making at least one pair of adjacent kerfs KO1 and KO2 that are offset toward each other by offset values O1 and O2 respectively, so as to create at least two opposing alignment posts Pw1 and Pw2 that are slightly wider in opposite directions, the kerfs KO1 and KO2 and a post substantially narrower than W being disposed in between Pw1 and Pw2;

making at least one pair of adjacent alignment kerfs Kn1 and Kn2, either one of which is narrower than K, and are offset toward each other by offset values O1 and O2 respectively, so as to create between Kn1 and Kn2 an alignment post Pw that has a width greater than the desired width W of the plurality of posts; and making at least one alignment kerf Kn that is narrower than K and W, so as to create on each side of the alignment kerf Kn two alignment posts Pw1 and Pw2 that are wider than W.

13. A computer-readable storage medium having stored therein computer-readable instructions for a processing system, wherein said instructions when executed by said processing system cause said processing system to:

determine desired spacing criteria for a plurality of posts and kerfs in a pair of slabs, as well as desired widths W of the posts and desired widths K of the kerfs which are larger than the widths W of the posts; wherein the posts in a first slab in the pair are configured to be received into corresponding kerfs in a second slab in the pair and vice versa, so that the pair of slabs can be interdigitated to assemble a composite in which there is at least one gap between each post and its corresponding kerf of a desired width; and generate dimensions, relative positions, and alignment criteria for at least one of an alignment post and an alignment kerf, in at least one of the slabs, wherein the alignment post and the alignment kerf are configured to allow the plurality of posts and kerfs to be correctly aligned and positioned, in accordance with the desired alignment criteria and to cause the size of the at least one gap between each post and its corresponding kerf when the posts in the first slab are received into the corresponding kerfs in the second slab to be substantially the desired width.

* * * * *